United States Patent
Schuelein (10) Patent No.: US 7,139,951 B2
(45) Date of Patent: Nov. 21, 2006

(54) SCAN ENABLED STORAGE DEVICE

(75) Inventor: Mark E. Schuelein, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 329 days.

(21) Appl. No.: 10/880,354

(22) Filed: Jun. 29, 2004

(65) Prior Publication Data

US 2005/0289417 A1    Dec. 29, 2005

(51) Int. Cl.
*G01R 31/28* (2006.01)

(52) U.S. Cl. .................................................. 714/726

(58) Field of Classification Search ................. None
See application file for complete search history.

(56) References Cited

U.S. PATENT DOCUMENTS

| | | | | |
|---|---|---|---|---|
| 4,580,066 | A | * | 4/1986 | Berndt ........................ 327/197 |
| 6,032,278 | A | * | 2/2000 | Parvathala et al. ......... 714/726 |
| 6,182,256 | B1 | * | 1/2001 | Qureshi ....................... 714/726 |
| 6,810,498 | B1 | * | 10/2004 | Shimizu ...................... 714/726 |

* cited by examiner

*Primary Examiner*—Christine T. Tu
(74) *Attorney, Agent, or Firm*—LeMoine Patent Services, PLLC (57) ABSTRACT

A scan enabled storage device includes two storage elements and two input circuits. A data input circuit accepts a data signal, a clock signal, and a scan enable signal to inhibit the operation of the clock signal. A scan data input circuit accepts a scan data signal and a scan clock signal.

18 Claims, 7 Drawing Sheets

SCAN ENABLED STORAGE DEVICE

FIELD

The present invention relates generally to data storage circuits, and more specifically to storage devices that accept scan data.

BACKGROUND

Some digital data storage devices include a "scan" ability that allows data to be scanned in for test purposes. Scan circuitry, when added to a storage device, may increase the size of the device, slow the device down, or otherwise impact the device.

DESCRIPTION OF EMBODIMENTS

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 1:
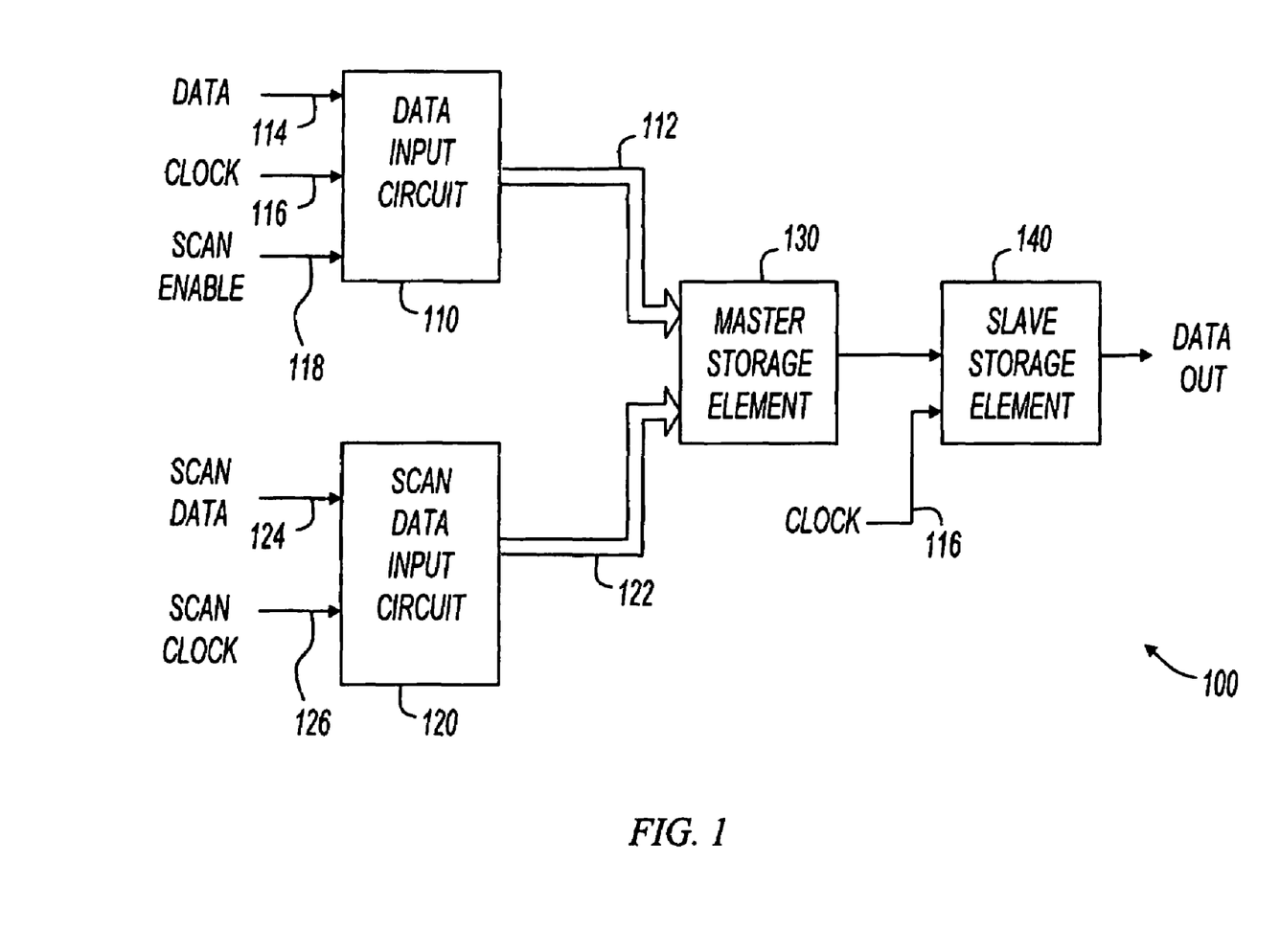
FIG. 1 shows a diagram of a scan enabled storage device.

FIG. 1 shows a scan enabled storage device in accordance with various embodiments of the present invention. Scan enabled storage device 100 includes two storage elements: master storage element 130, and slave storage element 140. Scan enabled storage device 100 also includes data input circuit 110 and scan data input circuit 120. Data input circuit 110 receives data on node 114, a clock on node 116, and a digital scan enable signal on node 118. Scan data input circuit 120 receives scan data on node 124 and a scan clock on node 126.

In operation, data input circuit 110 provides input data to master storage element 130 on data transmission media 112, and scan data input circuit 120 provides input data to master storage element 130 on data transmission media 122. In some embodiments, data transmission media 112 and 122 are separate digital data lines providing data to master storage element 130. In other embodiments, data transmission media 112 and 122 represent at least one common output node from data input circuit 110 and scan data input circuit 120, driving at least one input node of master storage element 130.

Data input circuit 110 provides data received on node 114 to master storage element 130 when the scan enable signal on node 118 is de-asserted. When the scan enable signal on node 118 is asserted, data input circuit 110 is disabled, and does not provide data to master storage element 130. In some embodiments, a clock circuit within data input circuit 110 is disabled upon the assertion of the scan enable signal on node 118. Further, in some embodiments, data input circuit 110 presents a high impedance output when the scan enable signal is asserted. Various embodiments of data input circuits are described below with reference to later figures.

Scan data input circuit 120 receives scan data and a scan clock and conditionally provides scan data to master storage element 130 on digital transmission media 122. In some embodiments, scan data input circuit 120 includes a level sensitive circuit responsive to the scan clock on input node 126. For example, in some embodiments, when the scan clock on node 126 is at a particular level (high or low), scan data input circuit 120 may provide data to storage element 130 corresponding to the scan data received on node 124. Also for example, when the scan clock signal on node 126 is in the opposite state, scan data input circuit 120 may not provide any data to master storage element 130. In some embodiments, when scan data input circuit 120 is disabled, a high impedance is presented to master storage element 130 on digital transmission media 122.

As previously described, master storage element 130 may receive data from data input circuit 110 or from scan data input circuit 120. Slave storage element 140 receives the data stored in master storage element 130 under control of the clock signal on input node 116. Scan enabled storage device 100 may be referred to as a level sensitive scan design (LSSD) having two storage elements. The scan enabled storage device may operate in a normal mode in which data input circuit 110 sources data to master storage element 130, and may operate in a scan mode in which scan data input circuit 120 sources data to master storage element 130. During either normal operation or scan operation, the clock on node 116 causes slave storage element 140 to accept the data stored in master storage element 130.

Figure 2:
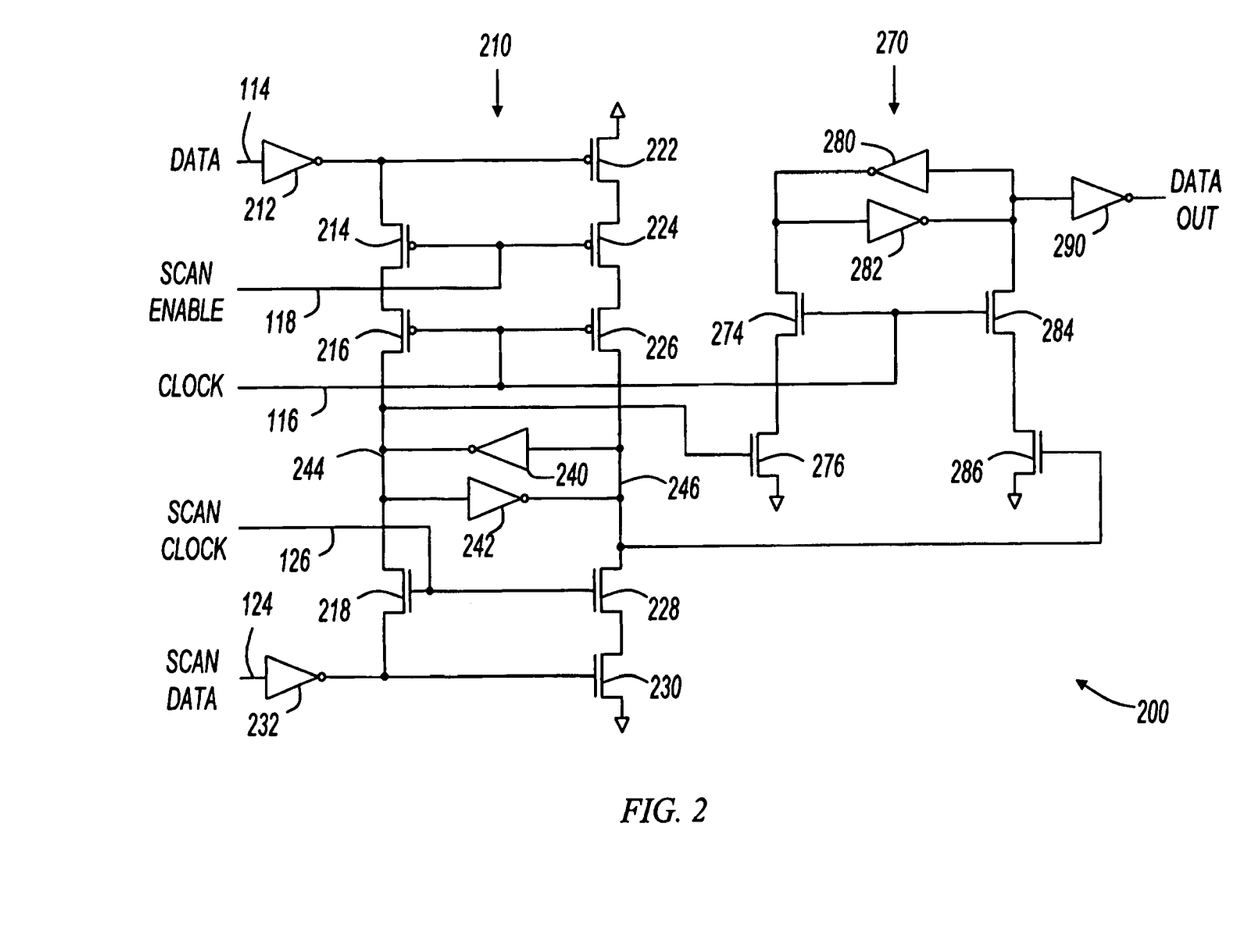
FIGS. 2–5 show schematics of scan enabled storage devices in accordance with various embodiments of the present invention.

FIG. 2 shows a schematic of a scan enabled storage device in accordance with various embodiments of the present invention. Scan enabled storage device 200 includes first stage 210 and second stage 270. First stage 210 includes inverters 212 and 232, transistors 214, 216, 218, 222, 224, 226, 228, and 230, and a latch formed from cross-coupled inverters 240 and 242.

The transistors in FIG. 2 and later figures are shown as isolated gate transistors, and specifically as metal oxide semiconductor field effect transistors (MOSFETs). For example, transistors 214, 216, 222, 224, and 226 are shown as P-type MOSFETs, and the remaining transistors are shown as N-type MOSFETs. Other types of switching or amplifying elements may be utilized for the various transistors of scan enabled storage device 200 without departing from the scope of the present invention. For example, the transistors of device 200 may be junction field effect transistors (JFETs), bipolar junction transistors (BJTs), or any device capable of performing as described herein.

Shown above cross-coupled inverters 240 and 242 are five transistors: transistors 214, 216, 222, 224, and 226. These transistors, along with inverter 212, form a data input circuit such as data input circuit 110 (FIG. 1). Transistors 216 and 226 are clock transistors coupled to be responsive to the clock signal received on node 116. Transistors 214 and 224 are enable transistors coupled to be responsive to the scan enable signal received on node 118. Inverter 212 and transistor 222 receive a digital data signal and propagate it to the remainder of the data input circuit. Transistors 222, 224, and 226 form a stack of transistors having gate nodes coupled to receive data, a scan enable signal and a clock signal. Further, transistors within inverter 212, and transistors 214 and 216 form a stack of transistors having gate nodes coupled to receive data, a scan enable signal, and a clock signal.

In operation, when the scan enable signal on node 118 is de-asserted low, the data input circuit is in normal operation, and enable transistors 214 and 224 are on and pass data to clock transistors 216 and 226. When the clock signal on node 116 is asserted low, the data propagates to the latch formed by cross-coupled inverters 240 and 242.

The portion of first stage 210 shown in FIG. 2 below the latch formed by cross-coupled inverters 240 and 242 correspond to a scan data input circuit, such as scan data input circuit 120 (FIG. 1). Transistors 218 and 228 are clock transistors coupled to be responsive to the scan clock signal on node 126. Inverter 232 and transistor 230 are coupled to receive scan data and to provide it to clock transistors 218 and 228. In some embodiments, an additional pair of enable transistors that are responsive to the scan enable signal are included in the scan data input circuit. In these embodiments, the operation of the scan clock may be disabled similar to the disabling of the normal clock signal shown in FIG. 2.

The latch formed by cross-coupled inverters 240 and 242 corresponds to a master storage element, such as master storage element 130 (FIG. 1). The latch is coupled to the data input circuit and the scan data input circuit by complementary nodes 244 and 246. When operating in normal mode, the data input circuit of first stage 210 drives a data signal on complementary nodes 244 and 246 when the clock signal on node 116 is low. Also in normal mode, the scan data input circuit provides a high impedance to complementary nodes 244 and 246 when enable transistors 218 and 228 are turned off by the operation of the scan clock on node 126. When operating in scan mode, the scan enable signal on node 118 is high, turning off transistors 214 and 224. As a result, regardless of the state of the data signal on node 114 or the clock signal on node 116, the data input circuit presents a high impedance to complementary nodes 244 and 246. In embodiments represented by FIG. 2, complementary nodes 244 and 246 correspond to data transmission media 112 and 122 (FIG. 1).

Second stage 270 includes clock transistors 274 and 284, input transistors 276 and 286, a latch formed by cross-coupled inverters 280 and 282, and output inverter 290. Input transistors 276 and 286 receive the state of the storage element within first stage 210, and transfer that state to the cross-coupled inverters 280 and 282 when clock transistors 274 and 284 are turned on by virtue of the clock signal on node 116 transitioning high. This operation of second stage 270 occurs regardless of the mode in which first stage 210 operates. For example, first stage 210 may store scan data as a result of being in scan mode. When first stage 210 stores scan data, second stage 270 receives that scan data upon transition of the clock signal on node 116. Also, for example, when operating in normal mode, first stage 210 stores data received on the data input node 114. Also when operating in normal mode, second stage 270 receives the data stored in first stage 210 upon the transition of the clock signal on node 116.

Scan enabled storage device 200 corresponds to a master/slave level sensitive scan design (LSSD) flip flop, in which the master stage includes a data input circuit, a scan data input circuit, and a master storage element, and the slave stage includes a slave storage element.

Figure 3:
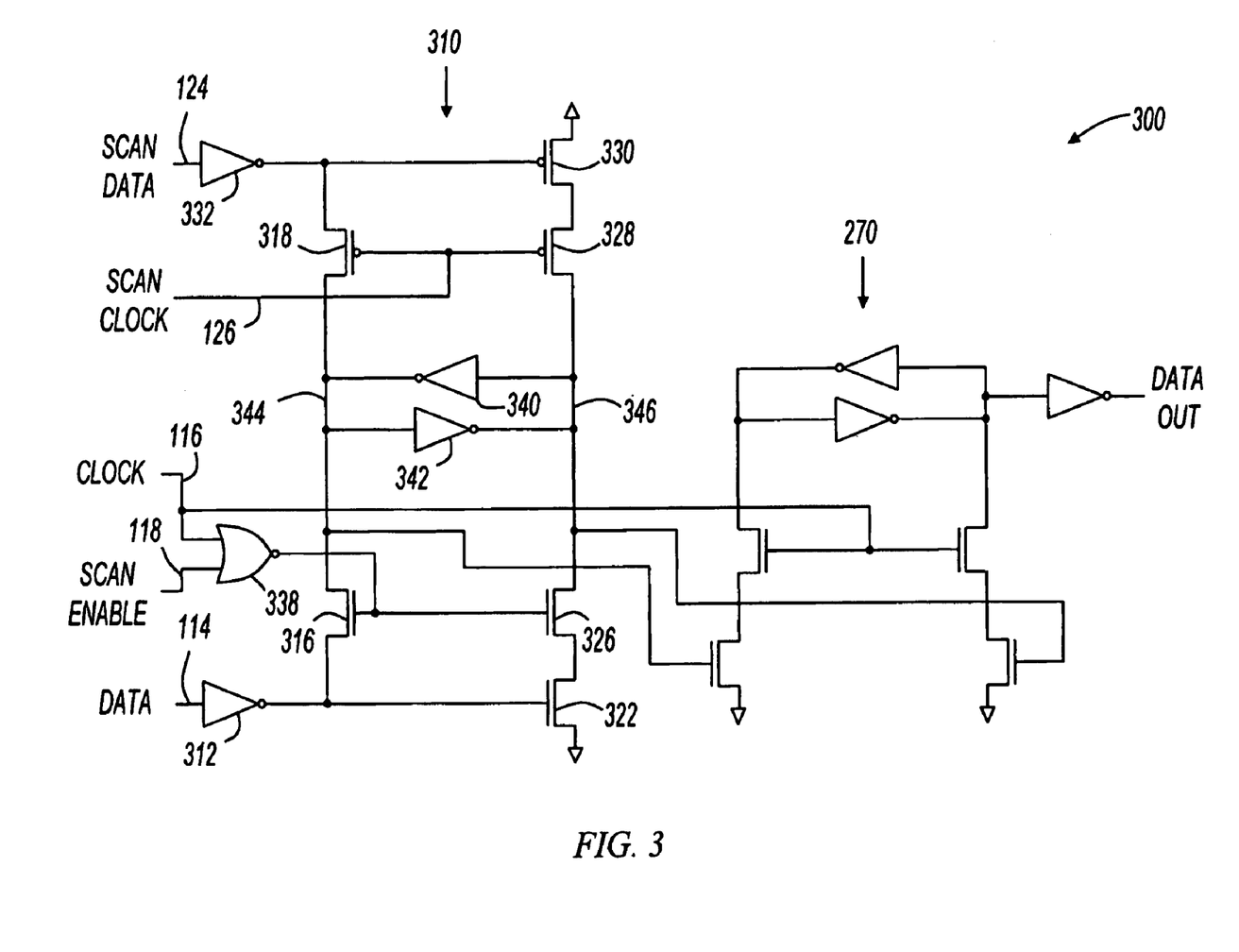

FIG. 3 shows a schematic of a scan enabled storage device in accordance with various embodiments of the present invention. Scan enabled storage device 300 includes first stage 310 and second stage 270. Second stage 270 is described above with reference to FIG. 2. First stage 310 includes inverters 332, 312, 340, and 342, and transistors 322, 316, 326, 318, 328 and 330. Input stage 310 also includes "NOR" gate 338. Transistors 318 and 328 are clock transistors coupled to be responsive to the scan clock signal on node 126. Inverter 332 and transistor 330 are coupled to receive the scan data on node 124, and to present that data to clock transistors 318 and 328. Inverter 332 and transistors 318, 328, and 330 form a scan data input circuit. This scan data input circuit is similar to that described above with reference to FIG. 2; however, the scan data input circuit of FIG. 3 is implemented using p-channel transistors rather than n-channel transistors.

Transistors 316 and 326 are clock transistors coupled to be responsive to a logical combination of the scan enable signal on node 118 and the clock signal on node 116. Inverter 312 and transistor 322 are coupled to receive data on node 114 and present that data to the clock transistors 316 and 326. NOR gate 338 receives the scan enable signal on node 118 and the clock signal on node 116 and provides a combined signal to control clock transistors 316 and 326. In this manner, the scan enable signal on node 118 may gate the operation of the clock signal on node 116 to disable the operation of the data input circuit which includes transistors 316, 326, and 322, and inverter 312.

Cross-coupled inverters 340 and 342 form a latch between complementary nodes 344 and 346. The latch formed by cross-coupled inverters 340 and 342 corresponds to a master storage element within first stage 310. As in embodiments described above with reference to FIG. 2, data is transferred from first stage 310 to second stage 270 upon the rising edge of the clock signal on node 116. This occurs regardless of whether first stage 310 is operating in normal mode or scan mode.

Figure 4:
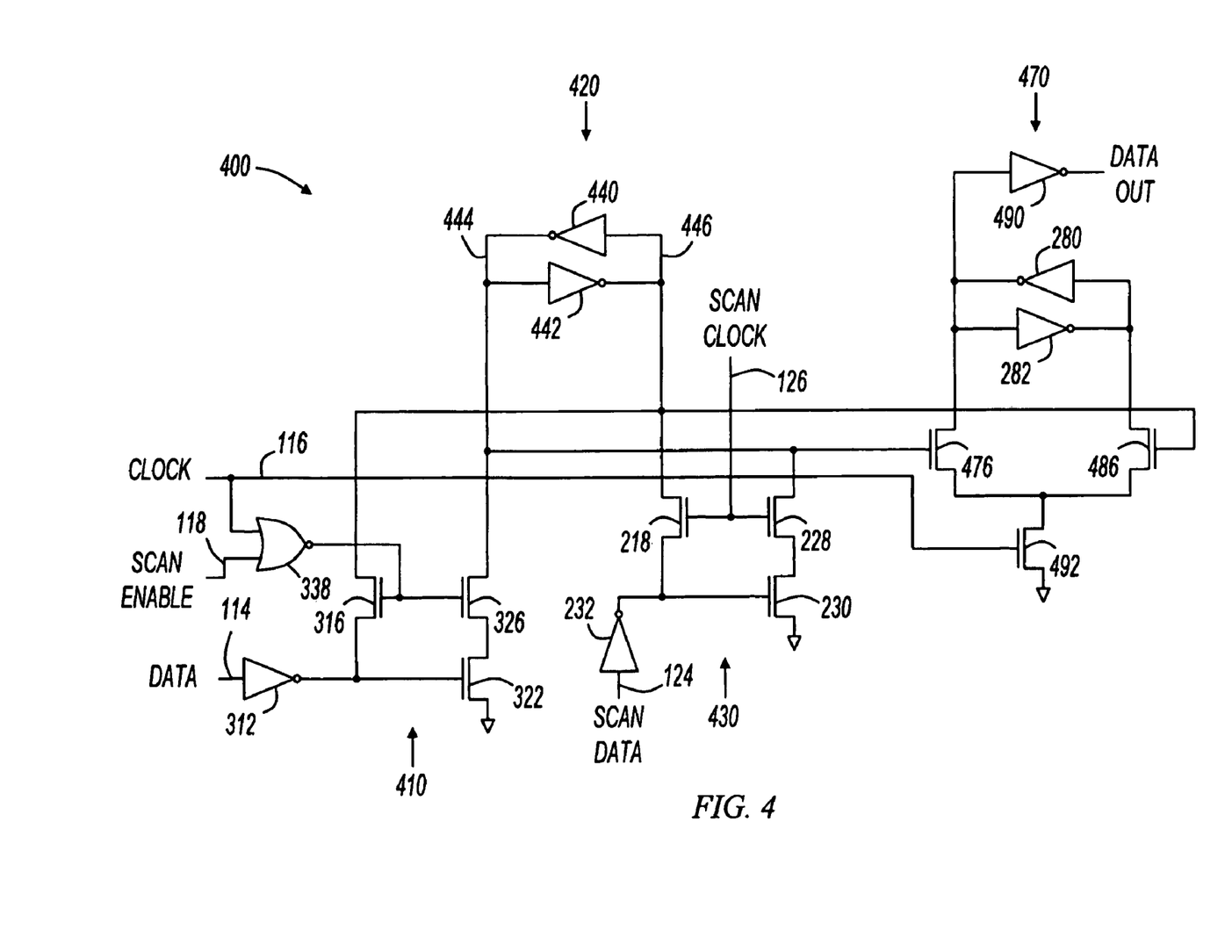

FIG. 4 shows a schematic of a scan enabled storage device in accordance with various embodiments of the present invention. Scan enabled storage device 400 includes data input circuit 410, scan data input circuit 430, master storage element 420, and slave storage element 470. Data input circuit 420 includes NOR gate 338, inverter 312, and transistors 316, 326, and 322. The circuit elements shown as part of data input circuit 410 are described above with reference to FIG. 3. Scan data input circuit 430 includes inverter 232 and transistors 218, 228, and 230. The circuit elements of scan data input circuit 430 are described above with reference to FIG. 2. Storage element 420 includes cross-coupled inverters 440 and 442. Cross-coupled inverters 440 and 442 operate to store data provided on complementary nodes 444 and 446 by either data input circuit 410 or scan data input circuit 430. In some embodiments, storage element 440 is implemented using circuitry other than cross-coupled inverters.

Second stage 470 includes transistors 476, 486, and 492, a storage element made up of cross-coupled inverters 280 and 282, and output inverter 490. Transistors 476 and 486 operate as input transistors, and are coupled to complementary nodes 444 and 446. Transistor 492 is coupled to receive the clock signal on node 116. When the clock signal on node 116 transitions from low to high, the contents of storage element 420 are stored in the storage element made up of cross-coupled inverters 280 and 282. Data is transferred from storage element 420 to second stage 470 by operation of the clock signal on node 116 regardless of whether data input circuit 410 is enabled or disabled. Further, data is transferred from storage element 420 to second stage 470 based on the operation of clock signal on node 116 regardless of whether the first stage is in scan mode or normal mode.

Figure 5:
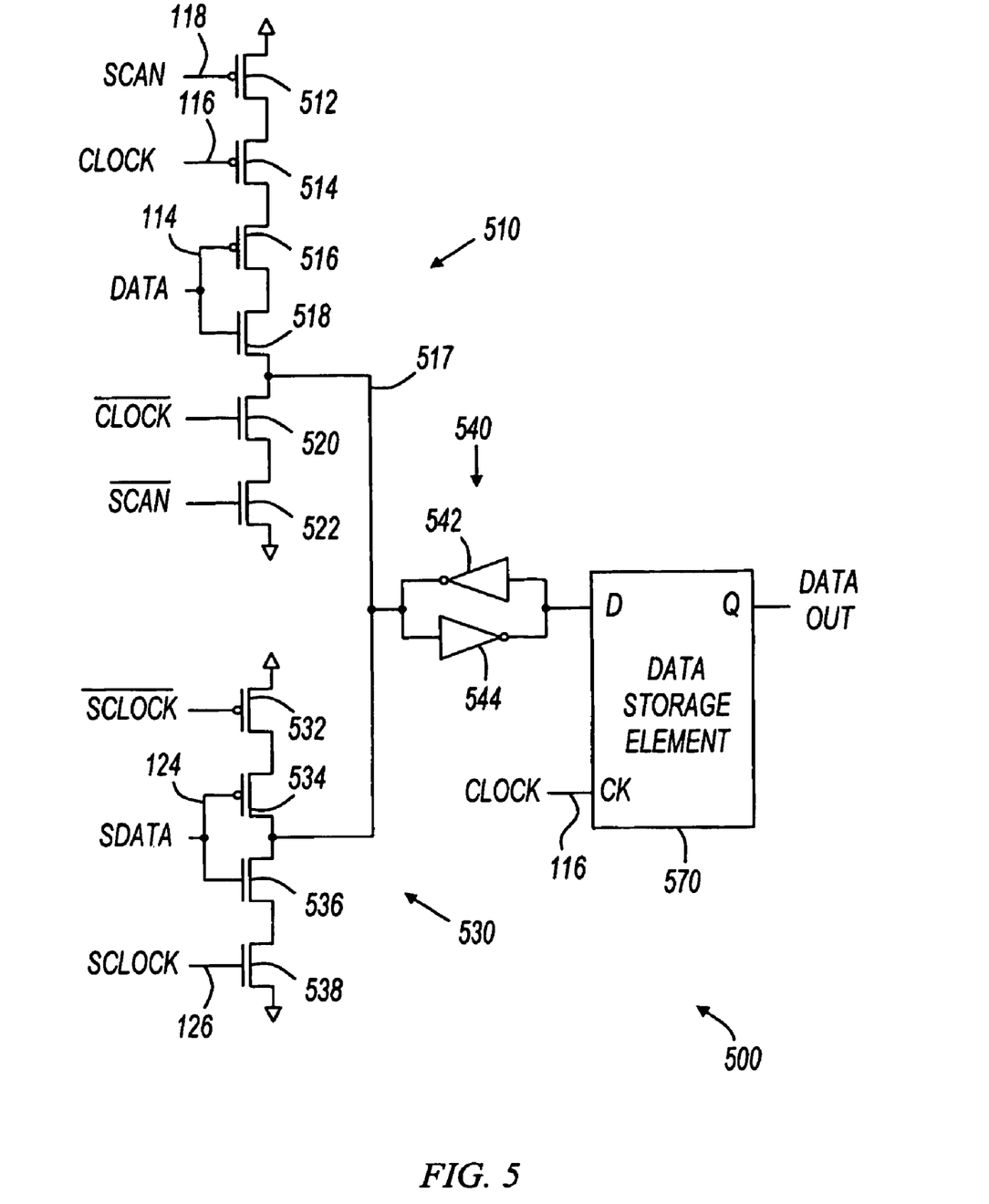

FIG. 5 shows a schematic of a scan enabled storage device in accordance with various embodiments of the present invention. Scan enabled storage device 500 includes data input circuit 510, scan data input circuit 530, latch 540, and data storage element 570. Data input circuit 510 includes transistors 512, 514, 516, 518, 520, and 522. Transistors 516 and 518 receive data and drive signal node 517 when the remaining transistors in data input circuit 510 are on. Transistors 514 and 520 are clock transistors controlled by the clock signal on node 116 and its complement, respectively. When the clock signal is high, transistors 514 and 520 are turned off and data input circuit 510 presents a high impedance to signal node 517 regardless of the value of the data on node 114. Transistors 512 and 522 are enable transistors controlled by the scan enable signal on node 118 and its complement, respectively. When the scan enable signal is low, transistors 512 and 522 are on, and data input circuit 510 is in normal operation. When the scan enable signal is high, transistors 512 and 522 are off, thereby disabling the operation of data input circuit 510. When disabled, data input circuit 510 is in scan mode, and presents a high impedance to signal node 517.

Scan data input circuit 530 includes transistors 532, 534, 536, and 538. Transistors 534 and 536 receive the scan data on node 124 and drive signal line 517 when the remaining transistors in scan data input circuit 530 are on. Transistors 532 and 538 are clock transistors in series with transistors 534 and 536. Clock transistors 538 and 532 receive the scan clock on node 126 and its complement, respectively. When the scan clock is low, transistors 532 and 538 are off and scan data input circuit 530 provides a high impedance to signal node 517. When the scan clock is high, transistors 532 and 538 are on, and scan data input circuit 530 drives a signal on node 517. Accordingly, transistors 532, 534, 536, and 538 from a tri-state inverter, where transistors 534 and 536 form an inverter, and transistors 532 and 538 conditionally turn off the inverter in response to the state of the scan clock.

Latch 540 includes cross-coupled inverters 542 and 544. Signal node 517, when driven with data by either data input circuit 510 or scan data input circuit 530, overcomes the output drive of inverter 542 and sets the state of latch 540. In some embodiments, one or both of inverters 542 and 544 are tri-state inverters that may be turned off. Although two cross-coupled inverters are shown to implement latch 540, this is not a limitation of the present invention. For example, any type of data storage element may be utilized for latch 540. Data storage element 570 may also be any type of data storage element. Data storage element 570 receives the clock signal on node 116 and receives data from latch 540, and produces output data when the clock signal transitions from low to high.

Scan enabled storage device 500 is an example of a level sensitive scan design (LSSD) flip flop built using two storage elements and two input circuits. One input circuit receives the normal data and the normal clock, and may be disabled by a scan enable signal. Another data input circuit receives scan data and a scan clock. Both input circuits may provide data to one latch, and data is transferred from the one latch to the second latch upon the transition of the normal clock signal.

Figure 6:
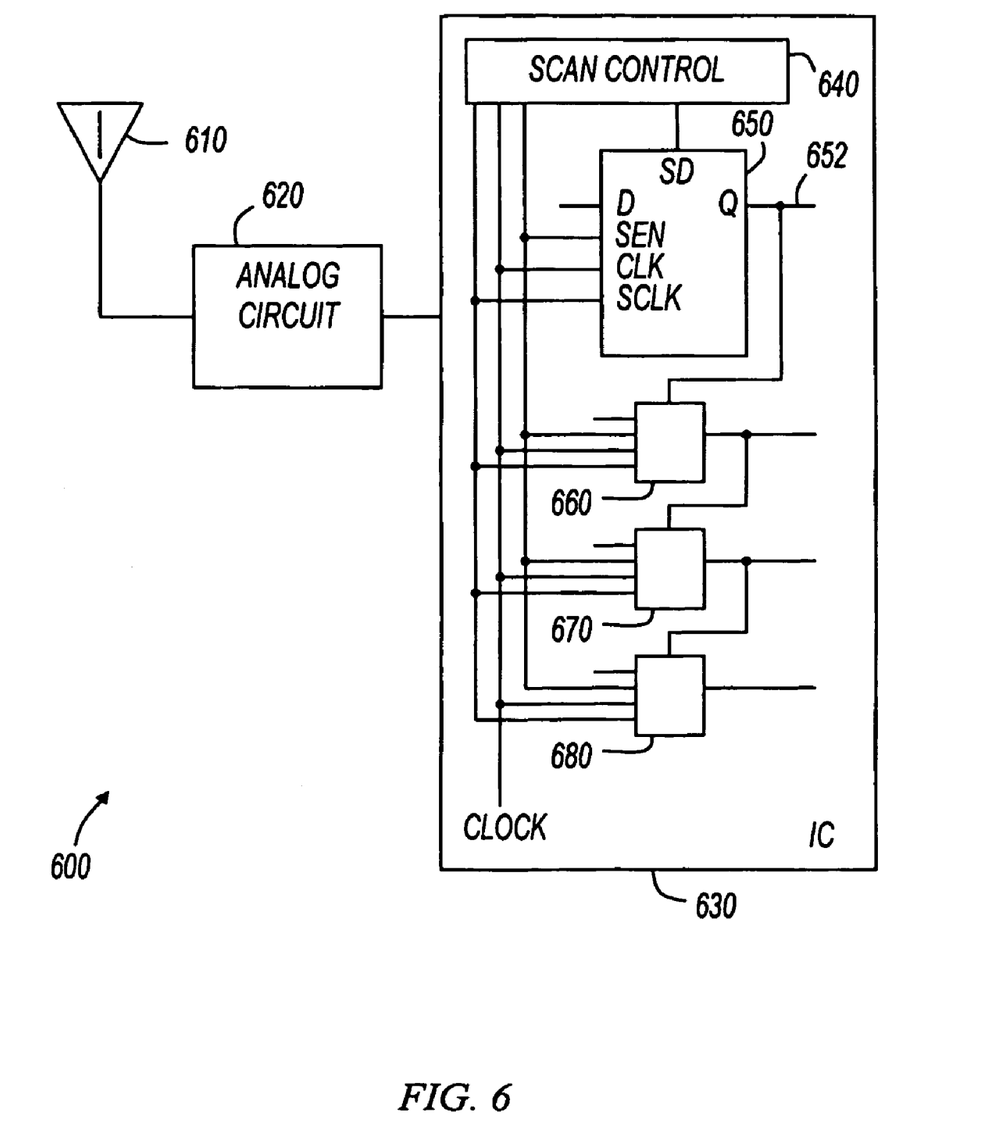
FIG. 6 shows a diagram of an electronic system in accordance with various embodiments of the present invention.

FIG. 6 shows a system diagram in accordance with various embodiments of the present invention. FIG. 6 shows system 600 including integrated circuit 630, analog circuit 620, and antenna 610. In operation, system 600 sends and receives signals using antenna 610, and these signals are processed by the various elements shown in FIG. 6. Antenna 610 may be a directional antenna or an omni-directional antenna. As used herein, the term omni-directional antenna refers to any antenna having a substantially uniform pattern in at least one plane. For example, in some embodiments, antenna 610 may be an omni-directional antenna such as a dipole antenna, or a quarter wave antenna. Also for example, in some embodiments, antenna 610 may be a directional antenna such as a parabolic dish antenna or a Yagi antenna. In some embodiments, antenna 610 may include multiple physical antennas.

Analog circuit 620 communicates with antenna 610 and integrated circuit 630. In some embodiments, analog circuit 620 includes a physical interface (PHY) corresponding to a communications protocol. For example, analog circuit 620 may include modulators, demodulators, mixers, frequency synthesizers, low noise amplifiers, power amplifiers, and the like. In some embodiments, analog circuit 620 may include a heterodyne receiver, and in other embodiments, analog circuit 620 may include a direct conversion receiver. In some embodiments, analog circuit 620 may include multiple receivers. For example, in embodiments with multiple antennas 610, each antenna may be coupled to a corresponding receiver. In operation, analog circuit 620 receives communications signals from antenna 610, and provides signals to integrated circuit 630. Further, integrated circuit 630 may provide signals to analog circuit 620, which operates on the signals and then transmits them to antenna 610.

In some embodiments, integrated circuit 630 may be a processor such as a microprocessor, a digital signal processor, a microcontroller, or the like. In other embodiments, integrated circuit 630 may be an integrated circuit other than a processor such as a radio frequency (RF) receiver, transmitter, or transceiver, an application-specific integrated circuit (ASIC), a communications device, a memory controller, or a memory such as a flash memory with floating gate memory cells. For ease of illustration, portions of integrated circuit 630 are not shown. Integrated circuit 630 may include much more circuitry than illustrated in FIG. 6 without departing from the scope of the present invention.

Integrated circuit 630 includes scan control block 640, and scan enabled storage devices 650, 660, 670, and 680. Scan enabled storage devices 650, 660, 670, and 680 may be implemented using any of the scan enabled storage device embodiments described herein, including devices 100 (FIG. 1), 200 (FIG. 2), 300 (FIG. 3), 400 (FIG. 4), or 500 (FIG. 5). Scan enabled storage devices 650, 660, 670, and 680 are coupled together to form a "scan chain." The scan chain is produced by coupling the data output node of each scan enabled storage device to the scan data input node of the next scan enabled storage device in the scan chain.

In embodiments represented by FIG. 6, the scan enable signal and scan clock signal are provided by scan control block 640. Also as shown in FIG. 6, scan control block 640 provides the scan data input signal for scan enabled storage device 650, which is the first storage device in the scan chain. In some embodiments, scan control block 640 is not included in integrated circuit 630, and one or more of the scan related signals shown being produced by scan control block 640 are instead produced by sources off of integrated circuit 630.

Example systems represented by FIG. 6 include cellular phones, personal digital assistants, wireless local area network interfaces, or any other suitable system. Many other systems uses for an integrated circuit with scan enabled storage devices exist. For example, integrated circuit 630 may be used in a desktop computer, a network bridge or router, or any other system without an antenna.

Storage devices, input circuits, latches, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process.

Figure 7:
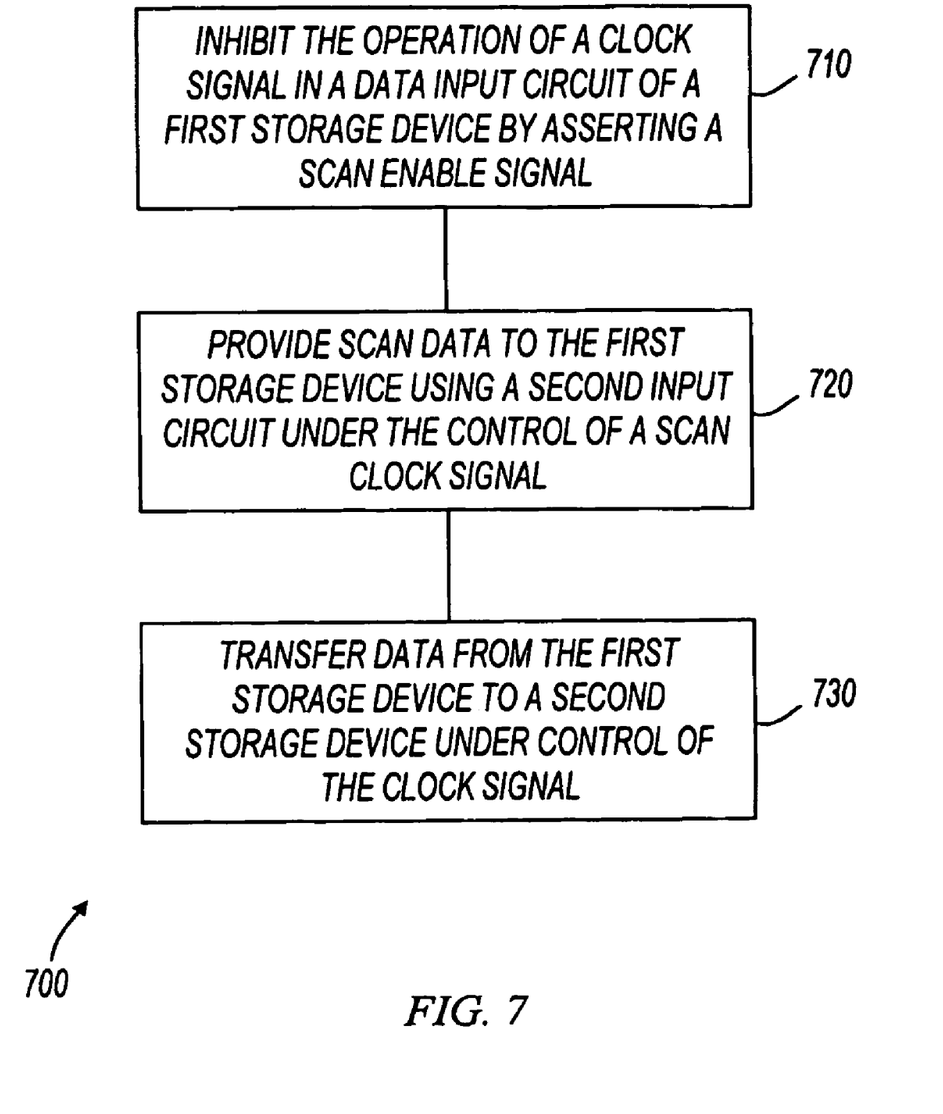
FIG. 7 shows a flowchart in accordance with various embodiments of the present invention.

FIG. 7 shows a flowchart in accordance with various embodiments of the present invention. In some embodiments, method 700 may be used to operate a scan enabled storage device. In some embodiments, method 700, or portions thereof, is performed by a scan enabled storage device, embodiments of which are shown in the various figures. In other embodiments, method 700 is performed by a control circuit within an integrated circuit. Method 700 is not limited by the particular type of apparatus performing the method. The various actions in method 700 may be performed in the order presented, or may be performed in a different order. Further, in some embodiments, some actions listed in FIG. 7 are omitted from method 700.

Method 700 begins at 710 in which the operation of a clock signal in a data input circuit of a first storage device is inhibited by asserting a scan enable signal. In some embodiments, the acts of block 710 correspond to asserting the scan enable signal on node 118 (FIGS. 1–5). Further, the acts of block 710 may correspond to turning off one or more transistors in a data input circuit to cause a high impedance to be presented on an output node of the data input circuit. For example, in scan enabled storage devices 200 (FIG. 2) and 500 (FIG. 5), the scan enable signal turns off transistors that are in series with clock transistors in a stack within the data input circuit. Also for example, in scan enabled storage devices 300 (FIG. 3) and 400 (FIG. 4), the scan enable signal gates the clock signal on node 116 to inhibit the operation of clock transistors.

At 720, scan data is provided to the first storage device using a second input circuit under the control of a scan clock signal. In some embodiments, the acts of block 720 correspond to the operation of various scan data input circuits of the present invention. For example, block 720 may correspond to the operation of scan data input circuit 120 (FIG. 1), 430 (FIG. 4), 530 (FIG. 5), or the scan data input circuits described with reference to FIGS. 2 and 3. At 730, data is transferred from the first storage device to a second storage device under control of the clock signal. In some embodiments, the acts of block 730 correspond to transferring data from any of the first stages to any of the second stages described herein, including embodiments represented by FIGS. 1–5.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A data storage device comprising:
   a storage element;
   a first input circuit to provide data to the storage element, the first input circuit including a clock input node, a data input node, and a scan enable input node, wherein the scan enable input node is coupled to disable operation of the first input circuit; and
   a second input circuit to provide data to the storage element, the second input circuit including a scan data input node, and a scan clock input node.

2. The data storage device of claim 1 further comprising a second storage element coupled to receive data from the first storage element.

3. The data storage device of claim 2 wherein the second storage element is coupled to store data from the first storage element in response to a signal on the clock input node.

4. The data storage device of claim 1 wherein the first input circuit and second input circuit are coupled together at a common output node, the common output node coupled to provide data to the storage element.

5. The data storage device of claim 4 wherein the first input circuit includes circuitry to cause the first input circuit to present a high impedance to the common output node.

6. The data storage device of claim 1 wherein the first input circuit includes a stack of transistors having gate nodes coupled to the data input node, the clock input node, and the scan enable input node.

7. The data storage device of claim 1 wherein the second input circuit includes a tri-state inverter having enable transistors coupled to the scan clock input node.

8. The data storage device of claim 1 wherein the first input circuit includes at least one clock transistor and at least one enable transistor coupled in series with the at least one clock transistor, the at least one enable transistor having a gate node coupled to the scan enable input node.

9. A scan enabled storage device comprising:
   a latch;
   a first input circuit coupled to provide data to the latch, and coupled to accept a data signal, a clock signal, and a scan enable signal to disable the first input circuit; and
   a second input circuit coupled to provide scan data to the latch, and coupled to accept a scan data signal and a scan clock signal.

10. The scan enabled storage device of claim 9 wherein the first input circuit is coupled to provide data to the latch when the scan enable signal is in a first state, and to provide a high impedance to the latch when the scan enable signal is in a second state.

11. The scan enabled storage device of claim 10 wherein the second input circuit is coupled to provide scan data to the latch when the scan clock signal is in a first state, and to provide a high impedance to the latch when the scan clock signal is in a second state.

12. The scan enabled storage device of claim 9 wherein the latch comprises two cross-coupled inverters having complementary nodes.

13. The scan enabled storage device of claim 12 wherein the first input circuit includes two output nodes coupled to the complementary nodes.

14. The scan enabled storage device of claim 13 wherein the first input circuit includes a pair of enable transistors coupled to provide a high impedance to the complementary nodes under control of the scan enable signal.

15. The scan enabled storage device of claim 9 further comprising a second latch coupled to receive data from the latch under control of the clock signal.

16. An electronic system comprising:
an antenna; and
an integrated circuit coupled to the antenna, the integrated circuit comprising flip flops coupled in a scan chain, wherein at least one of the flip flops includes a storage element and a first input circuit to provide data to the storage element, the first input circuit including a clock input node, a data input node, and a scan enable input node, wherein the scan enable input node is coupled to disable operation of the first input circuit.

17. The electronic system of claim 16 further comprising a second input circuit to provide data to the storage element, the second input circuit including a scan data input node, and a scan clock input node.

18. The electronic system of claim 17 wherein the first input circuit is coupled to provide data to the storage element when a signal on the scan enable input node is in a first state, and to provide a high impedance to the storage element when the signal on the scan enable input node is in a second state.

* * * * *